(12) United States Patent
Elkholy et al.

(10) Patent No.: US 11,569,830 B1
(45) Date of Patent: Jan. 31, 2023

(54) TRANSITION AWARE DYNAMIC ELEMENT MATCHING

(71) Applicant: Avago Technologies International Sales Pte. Limited, Singapore (SG)

(72) Inventors: Ahmed Elkholy, Irvine, CA (US); Adesh Garg, Aliso Viejo, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 17/589,606

(22) Filed: Jan. 31, 2022

(51) Int. Cl.
| | |
|---|---|
| *H03M 1/06* | (2006.01) |
| *H03M 1/10* | (2006.01) |
| *H03M 1/08* | (2006.01) |
| *H03M 1/00* | (2006.01) |
| *H03M 1/70* | (2006.01) |

(52) U.S. Cl.
CPC ............... *H03M 1/10* (2013.01); *H03M 1/00* (2013.01); *H03M 1/089* (2013.01); *H03M 1/0845* (2013.01); *H03M 1/70* (2013.01)

(58) Field of Classification Search
CPC .......... H03M 1/10; H03M 1/70; H03M 1/089; H03M 1/0845; H03M 1/00
See application file for complete search history.

(56) References Cited

U.S. PATENT DOCUMENTS 9,484,947 B1 * 11/2016 Nguyen ................ H03M 1/002

* cited by examiner

*Primary Examiner* — Joseph J Lauture
(74) *Attorney, Agent, or Firm* — Adsero IP

(57) ABSTRACT

A system includes a digital-to-analog converter comprising a plurality of unit elements, and a dynamic element matching encoder coupled to the digital-to-analog converter. The dynamic element matching encoder includes a circuit configured to determine a number of unit elements of a digital-to-analog converter to be transitioned ($N_{tm}$), determine a first number of unit elements to be turned on, and determine a second number of unit elements to be turned off. The circuit may further generate a first signal identifying individual unit elements of one or more unit elements of the digital-to-analog converter in the off state to be turned on, and a second signal identifying the individual unit elements of one or more unit elements of the digital-to-analog converter in the on state to be turned off.

20 Claims, 5 Drawing Sheets

Input code(n)
405 delta(n)
=code(n)−code(n-1)
410

Error Profile: Ntrn too high
415a → More noise

Error Profile
Ntrn Optimum = max(delta(n))
→ No HD2 with min. noise
415b

Error Profile: Ntrn too low
→ HD2 starts to show up
415c

400

TRANSITION AWARE DYNAMIC ELEMENT MATCHING

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for dynamic element matching in digital-to-analog converters.

BACKGROUND

Many modern high-speed communication systems, including wireless and wireline communication systems, have become digital-to-analog converter (DAC) based systems. High-resolution, high-speed DACs typically suffer from mismatch in timing or amplitude, which limits overall performance of these systems. Conventional approaches to mitigating these errors result in increased power consumption and hardware complexity while not addressing harmonic effects of the data waveform.

Thus, methods, systems, and apparatuses for transition aware dynamic element matching are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
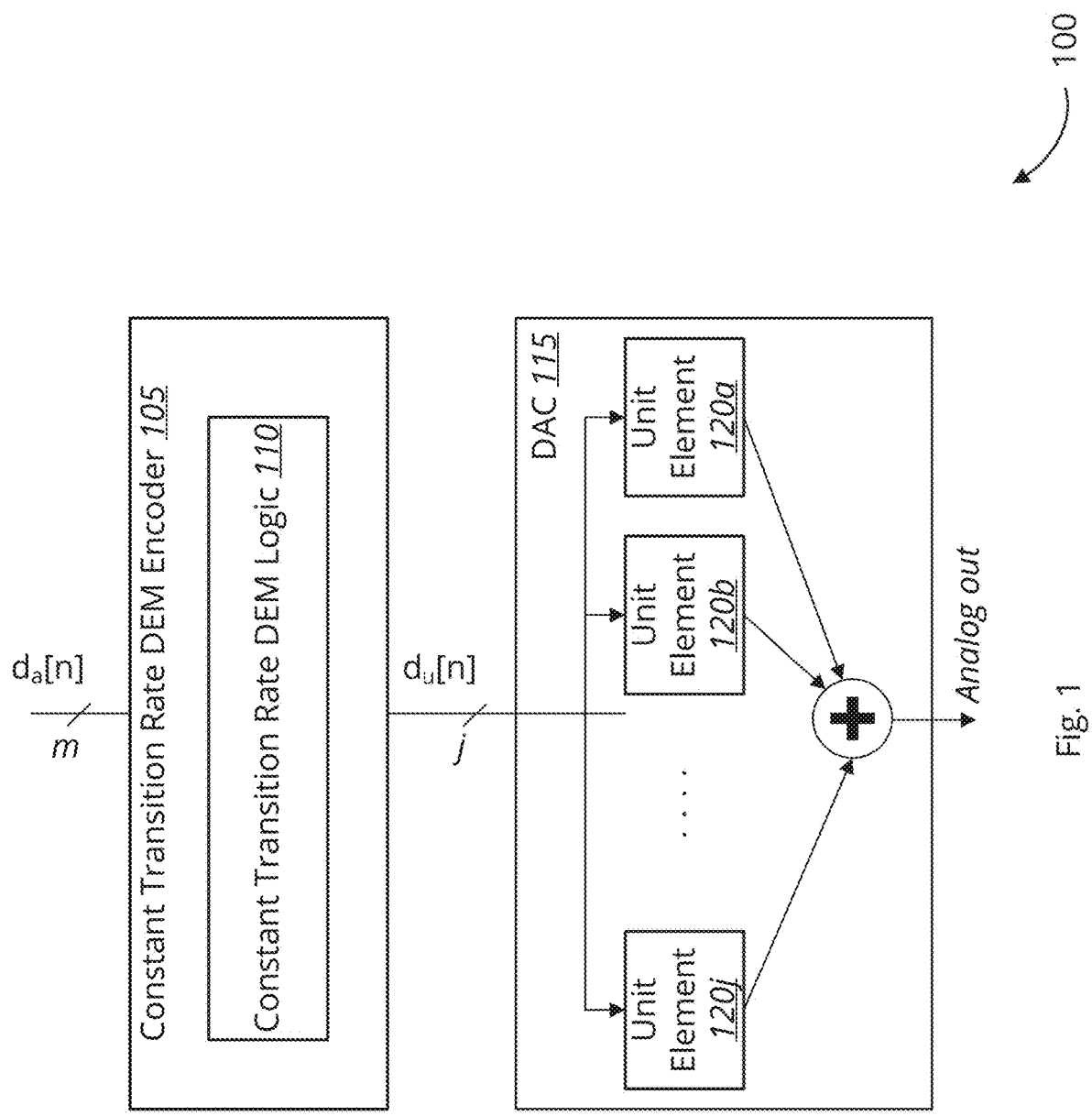
FIG. 1 is a schematic block diagram of a transition aware dynamic element matching digital-to-analog converter system, in accordance with various embodiments.

Various embodiments provide tools and techniques for transition aware dynamic element matching.

In some embodiments, a method for transition aware dynamic element matching is provided. The method may include determining a number of unit elements of a digital-to-analog converter to be transitioned ($N_{tm}$), from an on state to an off state, or an off state to an on state. The method may continue by determining a first number of unit elements of a digital-to-analog converter to be turned on from an off state, based, at least in part, on $N_{tm}$, and determining a second number of unit elements of the digital-to-analog converter to be turned off from an on state, based, at least in part, on $N_{tm}$. The method may further include selecting, via dynamic element matching logic, the first number of individual unit elements from one or more unit elements of the digital-to-analog converter in the off state to be turned on, and selecting, via the dynamic element matching logic, the second number of individual unit elements from one or more unit elements of the digital-to-analog converter in the on state to be turned off.

In some embodiments, an apparatus for transition aware dynamic element matching is provided. The apparatus may include a register configured to store a constant transition rate value, wherein the constant transition rate value is given by a number of unit elements of a digital-to-analog converter to be transitioned ($N_{tm}$), from an on state to an off state, or an off state to an on state. The apparatus may further include a dynamic element matching circuit coupled to the register. The dynamic element matching circuit may be configured to determine a first number of unit elements of a digital-to-analog converter to be turned on from an off state, based, at least in part, on $N_{tm}$, and determine a second number of unit elements of the digital-to-analog converter to be turned off from an on state, based, at least in part, on $N_{tm}$. The dynamic element matching circuit may further be configured to generate a first signal, wherein the first signal indicates a selection of the first number of individual unit elements, wherein the first signal further identifies the individual unit elements of one or more unit elements of the digital-to-analog converter in the off state to be turned on, and generate a second signal, wherein the second signal indicates a selection of the second number of individual unit elements, wherein the second signal further identifies the individual unit elements of one or more unit elements of the digital-to-analog converter in the on state to be turned off.

In further embodiments, a system for transition aware dynamic element matching is provided. The system may include a digital-to-analog converter comprising a plurality of unit elements, each unit element configured to be controllable by a control signal. The system may further include a dynamic element matching encoder coupled to the digital-to-analog converter, the dynamic element matching encoder configured to generate the control signal based on a digital input, wherein the dynamic element matching encoder includes a circuit. The circuit may be configured to determine a number of unit elements of a digital-to-analog converter to be transitioned ($N_{tm}$), from an on state to an off state, or an off state to an on state. The circuit may further be configured to determine a first number of unit elements of a digital-to-analog converter to be turned on from an off state of an $N_{tm}$ number of transitions, and determine a second number of unit elements of the digital-to-analog converter to be turned off from an on state of the $N_{tm}$ number of transitions. The circuit may further generate a first signal, wherein the first signal indicates a selection of the first number of individual unit elements, wherein the first signal further identifies the individual unit elements of one or more unit elements of the digital-to-analog converter in the off state to be turned on, and generate a second signal, wherein the second signal indicates a selection of the second number of individual unit elements, wherein the second signal further identifies the individual unit elements of one or more unit elements of the digital-to-analog converter in the on state to be turned off.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional approaches to mitigating timing and amplitude errors in DACs often result in increased power requirements, increased hardware complexity, and an inability to address second harmonic distortion. Conventional techniques focus on indiscriminate randomization of errors by dynamically switching between DAC unit elements, as in conventional dynamic element matching (DEM), utilizing inefficient switching schemes. Specifically, DEM refers to techniques for randomizing errors attributable to individual unit elements by dynamically switching the individual DAC unit elements that are used for a given DAC code. This breaks the static relationship between the DAC code (e.g., an input code) and the errors by random rotation of the thermometer bits (e.g., a unary code for controlling the unit elements of the DAC). Other approaches utilize additional components, such as a dummy switch or a random signal chopper, each of which introduces additional complexity, inefficiency, switching noise, and increases in power consumption.

Thus, the embodiments set forth below may allow for a more efficient, targeted, transition aware dynamic element matching scheme for switching DAC unit elements. Specifically, the embodiments below describe the use of a constant transition rate DEM scheme to determine how many DAC unit elements and which individual DAC unit elements to switch. Advantages of the embodiments set forth below may include a constant current draw from the pre-driver power supply, which reduces power supply ripple and resulting intersymbol interference (ISI), and may further mitigate harmonic distortion ($HD_n$) spurs. Moreover, by utilizing the constant transition rate-DEM (CTR-DEM) approach, a "just enough" transient switching may be realized, without excessive increases to switching noise for lower power output signals as would result from conventional DEM schemes. These features may further help realize a lower noise floor that scales with signal power. Moreover, CTR-DEM may mitigate second harmonic distortion (HD2) by enforcing a constant transition rate, thereby making the error profile consistent.

The CTR-DEM algorithm may also be paired with other digital pre-distortion correction to further improve DAC performance. Moreover, the noise floor scales with input power to maintain a robust signal-to-noise ratio (SNR), which directly increases DAC dynamic range. CTR-DEM may be implemented entirely in the digital domain so as not to disturb the sensitive and high-speed analog sections of the DAC. Additionally, power supplies with reduced ripple may require less rigorous external filtering and isolation between the supplies, which can reduce system cost and increase the channel density and data throughput of the overall system. Compared to conventional DEM DACs, the embodiments set forth below may allow for scaling of the number of transitions with DAC output power and frequency, which further allows users to fine tune the SNR of the system.

FIG. 1 is a schematic block diagram of a transition aware dynamic element matching digital-to-analog converter system 100, in accordance with various embodiments. The system 100 includes a constant transition rate DEM (CTR-DEM) encoder 105, and a DAC 115. The CTR-DEM further includes CTR-DEM logic 110, and DAC 115 further includes one or more unit elements 120a-120j. It should be noted that the various components of the system 100 are schematically illustrated in FIG. 1, and that modifications to the various components and other arrangements of system 100 may be possible and in accordance with the various embodiments.

In various embodiments, CTR-DEM encoder 105 may be configured to receive an m-bit digital input $d_a[n]$, where m is an integer. The CTR-DEM encoder 105 may be configured to code the m-bit digital input to produce a j-bit unary code, $d_u[n]$, where j is an integer corresponding to a maximum decimal value of an m-bit number (e.g., $j=2^m-1$). For example, if m=4, j=15, with j corresponding to the 4-bit value of "1111." Similarly, for m=7, j=127.

In various examples, the CTR-DEM encoder 105 may be coupled to the DAC 115. The DAC 115 may include one or more unit elements 120a-120j. In some examples, the DAC 115 may have a j-number of unit elements corresponding to the number of bits of the digital output of the CTR-DEM encoder 105. Thus, in some examples, the digital output $d_u[n]$ may comprise j-number of individual bits, $d_{u,i}[n]$. Thus, in some examples, each individual bit $d_{u,i}[n]$ of the CTR-DEM encoder 105 may be a single-bit digital input of a corresponding i-th unit element 120a-120j, where i is an integer 1-j.

Accordingly, in some examples, the digital output (e.g., unary code) $d_u[n]$ may be a coded control signal generated by the CTR-DEM encoder 105, such as a unary-coded (also referred to as "thermometer coded") signal, which is generated from the binary digital signal $d_a[n]$. The digital output $d_u[n]$ may be a control signal that indicates, or otherwise selects, which unit elements 120a-120j of the DAC 115 are enabled.

In various examples, CTR-DEM logic 110 may be implemented in hardware, software, or a combination of hardware and software. In some examples, the CTR-DEM encoder 105 and CTR-DEM logic 110 may be implemented, without limitation, as a circuit (including logical circuits), custom integrated circuits (ICs), system on a chip (SoC), or field-programmable gate array (FPGA) implementations. In other examples, CTR-DEM encoder 105 may be implemented as part of a DAC controller. For example, CTR-DEM logic 110 may be implemented as part of the firmware of a DAC controller.

According to various embodiments, the DAC 115 may include circuitry and components to convert a digital signal into an analog signal, such as wireless (e.g., radio frequency (RF)) and/or wireline signals (e.g., fiber optic, copper-wire, twisted pair, etc.). The DAC 115 may include DACs of various architectures and/or designs, including, without limitation, pulse-width modulation (PWM) DACs, delta-sigma DACs, thermometer-coded DACs, oversampling DACs, noise-shaped DACs, digitally-controlled oscillators, resistor DACs (e.g., resistor ladder (R-2R) DACs), current DACs, voltage DACs, switched-capacitor DACs, unary DACs, binary-weighted DACs, or other suitable DAC designs. In further embodiments, DACs may implement a combination of designs, using a combination of components (e.g., resistors, capacitors, current sources, voltage sources, etc.). In yet further examples, DAC system 100 may be part of an ADC. For example, DAC system 100 may form at least part of a clock-data-recovery (CDR) circuit of an ADC. For example, DAC system 100 may be a phase interpolator DAC, configured to output an analog signal based on a phase interpolator code.

In some further examples, the DAC 115 may utilize a combined and/or hybrid design. For example, in various embodiments, the unit elements of DAC 115 may themselves be individual DACs. In some examples, the DAC 115 may include, without limitation, unary unit elements and/or binary-weighted unit elements. For example, in some embodiments, the DAC 115 may include a plurality of unary unit elements, where the respective outputs of all unit elements have the same weight. In other examples, a segmented or "hybrid" design may be utilized. In the segmented design, DAC 115 may include both unary unit elements (where the respective outputs of all unit elements are weighted the same), and binary-weighted unit elements (e.g., the outputs of unit elements may be respectively weighted).

In some examples, the DAC 115 may include j-number of unit elements 120a-120j. In some examples, updates to an analog signal may occur at a uniform sampling interval, with an n-th sampling interval denoted by "n." In a multi-bit DAC, to produce an analog signal, the outputs of the individual unit elements 120a-120j may be coupled to a summing node, which may add the individual analog signals to produce the output analog signal. The output analog signal may, thus, have a value corresponding to the value of an input unary code (e.g., $d_u[n]$).

In conventional DEM, mismatches in the unit elements 120a-120j may introduce error in the output of analog signal. For example, each unit element 120a-120j may have a random amplitude error ($r_i$). At any sample, the total amplitude error ($e_{amp}(n)$) may be given by the sum of the product of each respective unary code ($u_i(n)$) and random amplitude error $r_i$, for an i-th unit element 120a-120j, as follows:

$$e_{amp}(n) = \Sum_{i=1}^{j} u_i(n) \cdot r_i \qquad \text{(Eq. 1)}$$

In further examples, each transition (e.g., 0 to 0, 0 to 1, 1 to 1, and 1 to 0) of each unit element 120a-120j may result in a respective transient error waveform ($e_{00i}, e_{01i}, e_{11i}, e_{10i}$). Ignoring clock feedthrough, it may be assumed that $e_{00i}=e_{11i}=0$. Transition errors $e_{01i}$ and $e_{10i}$ may be decomposed into delay ($t_{del,i}$) and duty cycle ($t_{cyc,i}$) errors, where $e_{01i}=t_{cyc,i}-t_{del,i}$; and $e_{10i}=t_{cyc,i}+t_{del,i}$ for an i-th unit element 120a-120j. Thus, a total delay error ($e_{del}(n)$) and total duty-cycle error ($e_{cyc}(n)$) may be given as follows:

$$e_{del}(n) = \Sum_{i=1}^{j} -(u_i(n)-u_i(n-1)) \cdot t_{del,i} \qquad \text{(Eq. 2)}$$

and $$e_{cyc}(n) = \Sum_{i=1}^{j} |u_i(n)-u_i(n-1)| \cdot t_{cyc,i} \qquad \text{(Eq. 3)}$$

Harmonic distortion may be introduced by these errors, as $e_{amp}(n)$, $e_{del}(n)$, and $e_{cyc}(n)$ may have the same periodicity as the digital input. Thus, a constant transition rate DEM scheme may be implemented via the CTR-DEM logic 110, which is described in further detail below with respect to FIG. 2.

Figure 2:
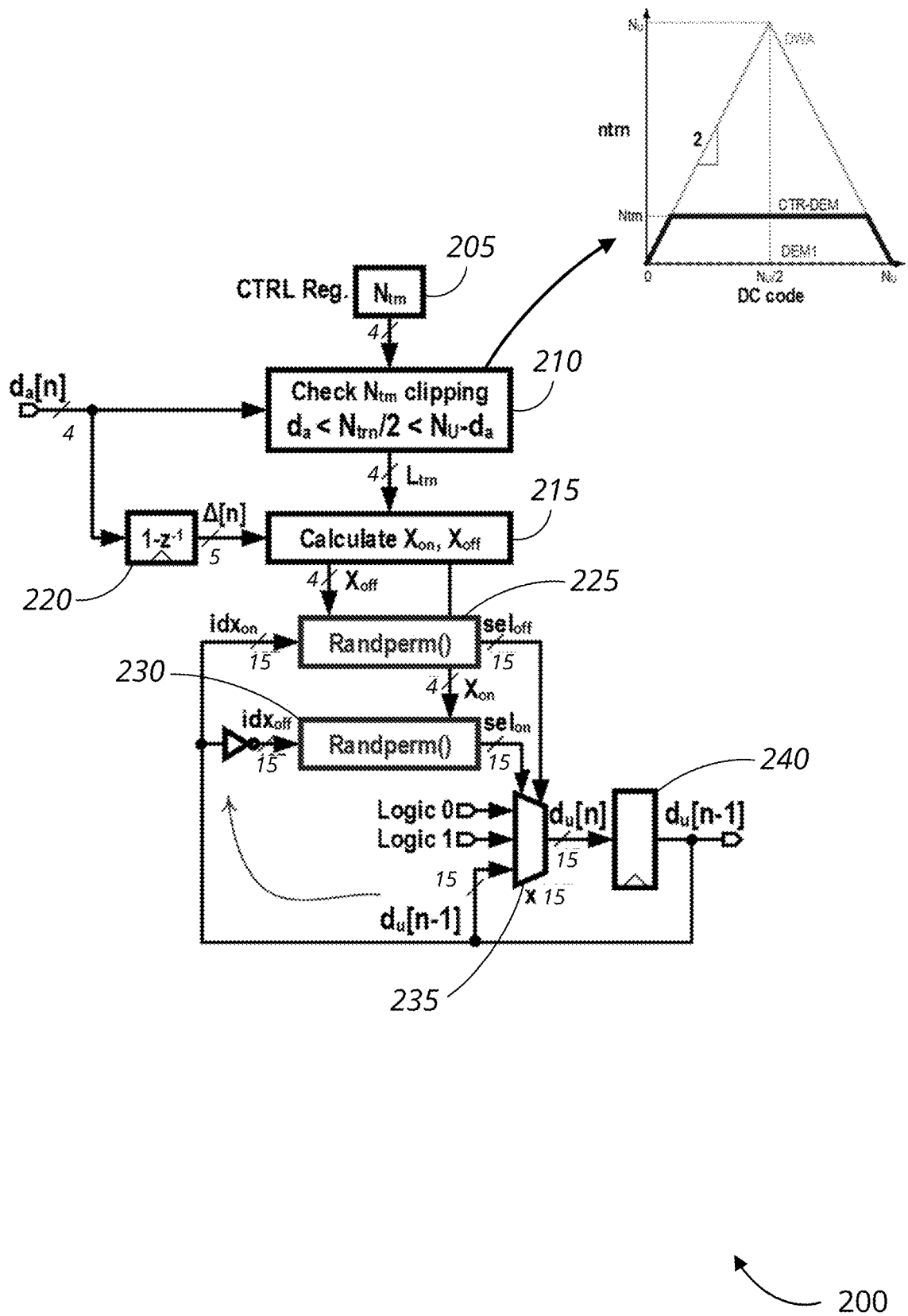
FIG. 2 is a schematic diagram of a transition aware dynamic element matching encoder logic circuit, in accordance with various embodiments.

FIG. 2 is a schematic diagram of a transition aware dynamic element matching encoder logic circuit 200, in accordance with various embodiments. The encoder logic circuit 200 includes a control register 205, a clipping detection logic 210, an on/off calculation logic 215, difference block 220, first random permutation logic 225, second random permutation logic 230, multiplexer 235, and flip-flop 240. It should be noted that the various components of the logic circuit 200 are schematically illustrated in FIG. 2, and that modifications to the various components and other arrangements of logic circuit 200 may be possible and in accordance with the various embodiments. In various embodiments, encoder logic circuit 200 and its various logic and subcomponents may be implemented as hardware, such as digital logic and/or logic circuits, utilizing various hardware and logic components.

According to various embodiments, the control register 205 may store a 4-bit value of a constant transition rate. It is to be understood that the number of bits of the control register are not limited to 4-bits, and in some embodiments, may include more or less bits. In some further examples, the number of bits of the control register 205 may correspond to the value of the constant transition rate.

In various examples, the constant transition rate may indicate a number of transitions ($N_{tm}$) to be performed at each sample interval. In some examples, $N_{tm}$ may be set as a static value, which may be a fixed number of transitions in the unary code, where the unary code is further based on an input code (e.g., digital input $d_a[n]$). In some examples, $N_{tm}$ may be determined based on an amplitude of the delta code, which may be given by:

$$\Delta[n] = \text{code}(n) - \text{code}(n-1) \qquad \text{(Eq. 4)}$$

where code(n) and code(n−1) are the input code, and may be used interchangeably with input code "$d_a[n]$" and "$d_a[n-1]$."

In further examples, $N_{tm}$ may be an adjustable value. For example, in some embodiments, $N_{tm}$ may be set by a user. In other examples, $N_{tm}$ may be adjusted on-the-fly and/or in real-time based on system requirements and/or metrics. For example, in some embodiments, the DAC may receive feedback from a receiver requesting an increase or decrease in amplitude (e.g., power). The DAC may, accordingly, increase $N_{tm}$ in response to a request to increase amplitude, and decrease $N_{tm}$ in response to a decrease in amplitude. In the case of modulated data, for example, in a wireless DAC, $N_{tm\_opt}$ may be determined as a function of carrier frequency and the type of data being transmitted. For example, a data signal may exhibit a peak to average ratio, which may be used to set an optimal $N_{tm}$.

As previously described, in some embodiments, $N_{tm}$ may be a hard-coded value. In some examples, the hard-coded value may be determined based on known signal characteristics for a given use case or for one or more common applications. In some examples, an optimal number of transitions, $N_{tm\_opt}$, may be set equal to a maximum value of the delta code: $\max(\Delta[n])$. This may result in an error profile with no HD2 and a minimum noise floor needed to suppress HD2.

In various examples, an optimal $N_{tm\_opt}$ may be directly proportional to the amplitude of the digital input $P_{sig}$, and frequency of the digital input $F_{sig}$. The selection of $N_{tm}$ and its effects are described in further detail below, with respect to FIG. 4.

In some examples, clipping detection logic 210 may be configured to check for $N_{tm}$ clipping. Specifically, the clipping detection logic 210 may receive the digital input $d_a[n]$ and $N_{tm}$, and compare the two inputs to ensure the condition $d_a < N_{tm}/2 < N_u - d_a$ is met, where $N_u$ is the number of unit elements. Thus, clipping detection logic 210 may ensure an $N_{tm}$ is selected such that there are enough unit elements that can be transitioned to generate the correct unary coded output, $d_u[n]$. For example, if an $N_{tm}$ is selected that is too large (e.g., $N_{tm}/2 > N_u - d_a$), then there is a smaller range of digital input values $d_a$ for which $N_{tm}$ may be enforceable. Thus, if $N_{tm}$ is too high, in some examples, $N_{tm}$ may be reduced. On the other hand, if $N_{tm}$ is too low, then HD2 and other harmonic distortion may appear. In some examples, if $N_{tm}$ is too low, the clipping detection logic may be configured to add additional transitions (e.g., $N_{tm}+1$), without affecting the absolute value of the unary coded output. Accordingly, in various examples, a value $N_{tm}$ that falls within the range $d_a < N_{tm}/2 < N_u - d_a$ may be output by the clipping logic 210 as the signal $L_{tm}$.

In some alternative embodiments, the DAC (such as DAC 115) may further include one or more redundant unit elements. In such embodiments, the one or more redundant unit elements may be switched on or off as needed to avoid clipping. In some examples, the one or more redundant elements may act as "zero padding" for the input code, and remain in an off state (or in some examples an on state) until the one or more redundant unit elements are needed to enforce $N_{tm}$ transitions for a given input code, even as the code approaches 0 code (e.g., an all "0" code) or full code (e.g., an all "1" code). In this configuration, $L_{tm}$ may be equal to $N_{tm}$, and the bit-width j of the unary code $d_u[n]$ may be increased by the number of redundant DAC unit (k). Accordingly, for an m-bit input code, the number of bits j may be given by: $j=(2^m-1)+k$. In some examples, the one or more redundant unit elements may be provided alongside clipping detection logic 210. In other embodiments, the clipping detection logic 210 may be skipped, and the one or more redundant unit elements used instead.

In various embodiments, the on/off calculation logic 215 may be configured to calculate a number of unit elements to be turned on ($X_{on}$) and a number of unit elements to be turned off ($X_{off}$). Specifically, $X_{on}$ and $X_{off}$ may correspond to the number of unit elements to be switched on or off of the $L_{tm}$ number of transitions. Thus, in some examples, $X_{on}+X_{off}=L_{tm}$.

The on/off calculation logic 215 may be configured to receive, from difference block 220, a delta code $\Delta[n]$. Accordingly, in some examples, the difference block 220 may be a first difference backward z-transform, configured to determine a difference from a current code (e.g., digital input $d_a[n]$) and the previous code (e.g., digital input from the previous cycle $d_a[n-1]$). In this example, the previous cycle may refer to a previous sample interval of the DAC, such as DAC 105 and/or DAC system 100 of FIG. 1. As with the other components of the encoder logic circuit 200, the difference block 220 may also be a logic circuit. In some examples, the difference block 220 may be implemented using a register (e.g., one or more D-flip flops).

The on/off calculation logic 215 may thus determine, based on the delta code ($\Delta[n]$) and $L_{tm}$ a number of unit elements to be turned on during the transition, and the number of unit elements to be turned off. Thus, once the number of transitions $L_{tm}$ is determined, the change from the previous code (e.g., the delta code) may be used to determine how many additional unit elements need to be switched on or off. For example, if the delta code is 1, one additional unit may need to be turned on. Thus, the on/off calculation logic may set $X_{on}$ to be 1 more than $X_{off}$. Accordingly, in some examples, the relationship between $X_{on}$ and $X_{off}$ may be expressed as: $X_{on}=X_{off}+\Delta[n]$.

The number of units that need to be turned off, $X_{off}$, may be provided to first random permutation logic 225, and the number of units that need to be turned on, $X_{on}$, may be provided to second permutation logic 230. In various examples, the first and second random permutation logic 225, 230 may include various types of randomization and/or stochastic selection algorithms for randomizing and/or selecting individual unit elements to be switched on or off utilizing a respective algorithm (e.g., a random and/or stochastic algorithm for selecting the specific bit positions associated with individual unit elements of a plurality of unit elements to be switched). In some examples, the first and second random permutation logic 225, 230 may include various types of DEM algorithms, including, without limitation, random averaging, clocked averaging, individual level averaging, data weighted averaging, etc.

The first random permutation logic 225 may be configured to determine which individual unit elements should be turned off (e.g., unit elements to be switched off that were previously on) based on the input $X_{off}$ indicating the number of unit elements to be switched off, and a signal indicating which individual unit elements were turned on ($idx_{on}$) during a previous cycle (e.g., a previous sampling interval). Specifically, the first random permutation logic 225 may indicate which specific unit elements of $idx_{on}$ should be turned off during the current sampling interval. In some examples, $idx_{on}$ may be equal to the input unary code of the previous cycle, $d_u[n-1]$. Thus, in some examples, the first random permutation logic 225 may select an $X_{off}$ number of specific individual unit elements to be turned off from the unit elements indicated to have been on by the signal $idx_{on}$. For example, the specific individual unit elements to be turned off may be selected from $idx_{on}$ according to a randomization and/or stochastic selection algorithm (e.g., a dynamic element matching algorithm). The first random permutation logic 225 may then output a signal indicative of which unit elements have been selected to be turned off, $sel_{off}$.

The second random permutation logic 230 may be configured to determine which individual unit elements should be turned on (e.g., unit elements to be switched on that were previously off), based on the input $X_{on}$, indicating the number of unit elements to be switched on, and a signal indicating which of the individual unit elements were turned off ($idx_{off}$) during the previous cycle. Specifically, the second random permutation logic 230 may indicate which specific unit elements of $idx_{off}$ should be turned on during the current sampling interval. Accordingly, in some examples, $idx_{off}$ may be equal to the inverse of $d_u[n-1]$. In some examples, the second random permutation logic 230 may select an $X_{on}$ number of specific individual unit elements to be turned on from the unit elements indicated to have been off by the signal $idx_{off}$. For example, the specific individual unit elements to be turned on may be selected from $idx_{off}$ according to the randomization and/or stochastic selection algorithm. The second random permutation logic 230 may output a signal indicative of which unit elements have been selected to be turned on, $sel_{on}$.

In some examples, the output signals, $sel_{on}$ and $sel_{off}$, may be provided to multiplexer 235 as control signals for selecting between inputs of the multiplexer 235. Specifically, the input of the multiplexer 235 may include the input unary code of the previous cycle, $d_u[n-1]$ input, logic 1 (e.g., logic high), and logic 0 (e.g., logic low). According to some examples, $sel_{off}$ in the i-th bit position ($sel_{off,i}$) may equal 1 if the corresponding i-th unit element is to be turned off, and set equal to 0 when there is no change. Similarly, $sel_{on}$ in the i-th bit position ($sel_{on,i}$) may be equal 1 if the corresponding i-th unit element is to be turned on, and set equal to 0 when there is no change. In some examples, $sel_{off,i}$ and $sel_{on,i}$ may form a 2-bit control signal to the multiplexer for selecting the various inputs. Thus, if an i-th unit element of the DAC is to be switched off, a control signal of 10 may be generated, indicating that logic 0 should be output by the multiplexer 235. Similarly, if the i-th unit element of the DAC is to be switched on, a control signal of 01 may be generated, indicating that logic 1 should be output by the multiplexer 235. If a control signal of 00 is output, it may indicate that no transition should take place for the i-th unit element, and the unary code of the previous cycle in the i-th position, $d_{u,i}[n-1]$, may be output by the multiplexer 235. In this way, the multiplexer 235 may generate new input unary code for a current cycle, $d_u[n]$. The current input unary cycle may then be stored at flip-flop 240. In some examples, the flip-flop 240 may be clocked by a clock signal having a period equal to a sample interval (e.g., a sampling clock).

In this way, the encoder logic circuit 200 may generate an input unary code to switch unit elements of the DAC on and off according to a CTR-DEM scheme. Specifically, under the CTR-DEM framework, a constant number of transitions may be enforced (e.g., a constant number of transitions may be consistently performed at each sampling interval/cycle), with transition awareness—that is, awareness of whether a given unit element will undergo a transition from on to off, or off to on.

Figure 3:
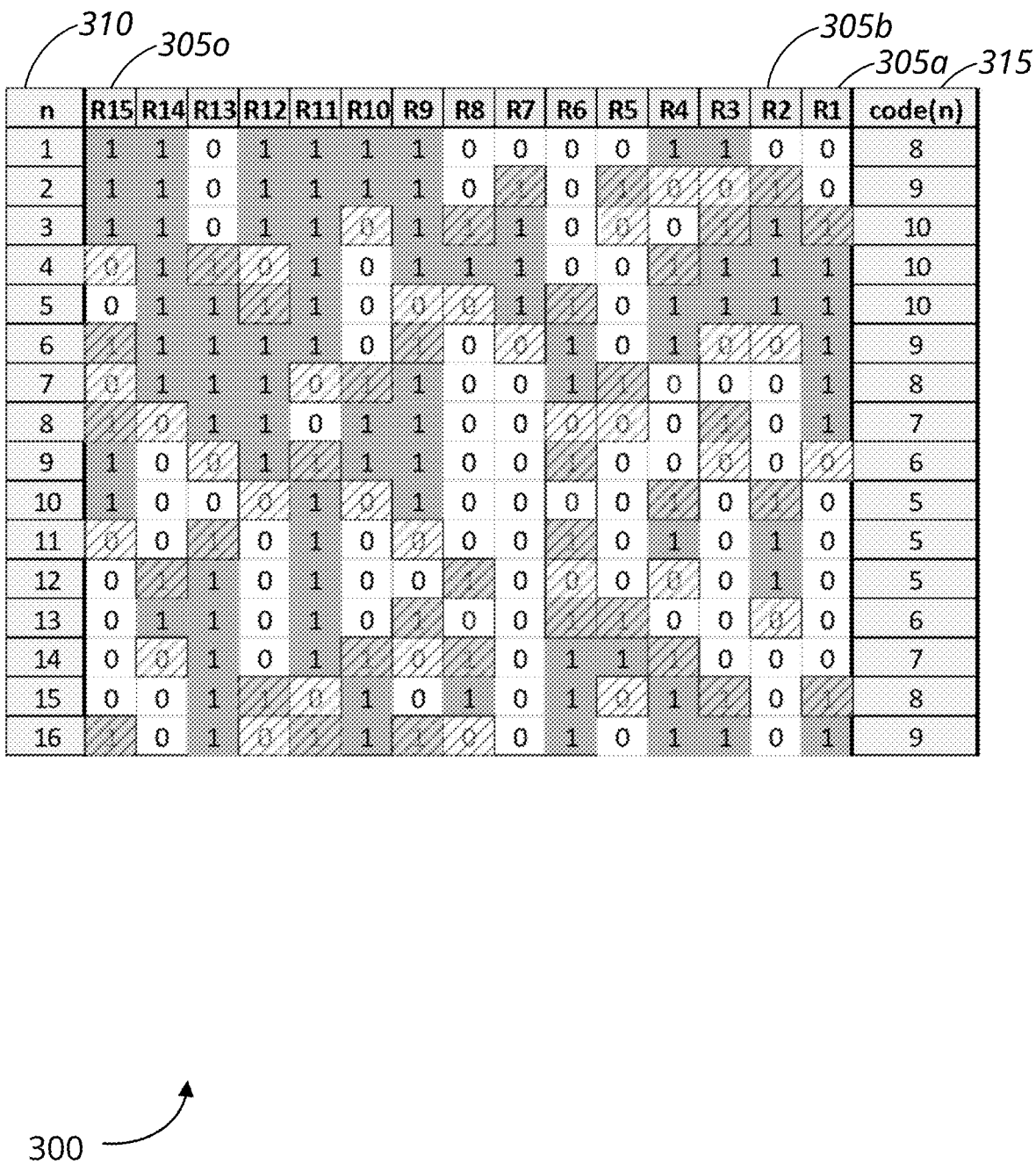
FIG. 3 is a schematic diagram illustrating a process of transition aware dynamic element matching, in accordance with various embodiments.

FIG. 3 is a schematic diagram illustrating a process 300 of transition aware dynamic element matching, in accordance with various embodiments. Specifically, FIG. 3 illustrates, in tabular form, individual unit elements 305a-305o, which includes a first unit element R1 305a through a fifteenth unit element R15 305o. Column "n" 310 may correspond to a cycle or sample interval, where n=1 may correspond to a first cycle, and so on and so forth. Code(n) 315 may correspond to the value of digital input $d_a[n]$ during the n-th cycle. The columns under each of the unit elements, R1 305a-R15 305o, may illustrate whether the respective unit element is on or off, and a corresponding bit of the unary code (e.g., $d_u[n]$) in the respective bit position corresponding to that unit element. A shaded square may indicate that the unit element is turned on, and the number 1 may indicate that the value of the unary code in the respective bit position is 0. A blank square may indicate that the unit element is turned off, and the number 0 may indicate that the value of the unary code in the respective bit position is 0. For example, for the first cycle n=1, when read across the entire row, the unary code $d_u[1]$=110111100001100, corresponding to the code(n) value of 8 (e.g., $d_a[1]$=1000).

Unit element transitions (e.g., from on to off, or off to on) are depicted as hatch-marked shaded squares (e.g., indicating a transition from off to on) and hatch-marked empty square (e.g., indicating a transition from on to off). In the illustrated example, an $N_{tm}$=5 is adopted. Thus, for each cycle, an $N_{tm}$ of 5 transitions is enforced (e.g., consistently performed at each cycle), corresponding to 5 transitions. For example, in the transition from n=1 to n=2, the code(n) value changes from code(1)=8 (alternatively, $d_a[1]$=1000) to code (2)=9 (alternatively, $d_a[2]$=1001). Accordingly, under CTR-DEM, to enforce an $N_{tm}$ of 5 transitions, $X_{on}$=3 and $X_{off}$=2 is used. Thus, the input unary code changes from $d_u[1]$=110111100001100 to $d_u[2]$=110111101010010, where R7, R5, and R2 are selected to be turned on from an off state (e.g., transition to an on state), and R4 and R3 are selected to be turned off from an on state (e.g., transition to an off state). In this way, the CTR-DEM scheme may continue, so on and so forth, through each of the remaining cycles n=3 through n=16.

Figure 4:
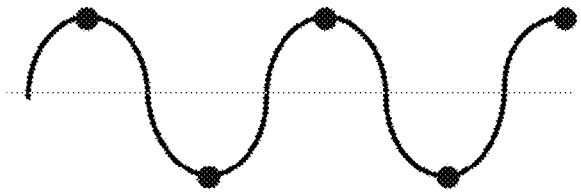
FIG. 4 is a timing diagram illustrating the relationship between the number of transitions and timing error, in accordance with various embodiments.
Figure 4:
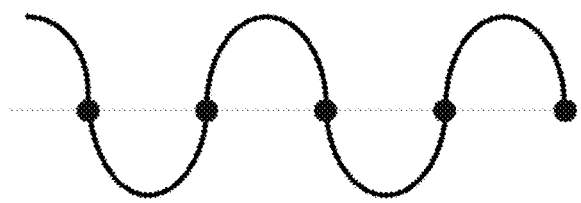
Figure 4:
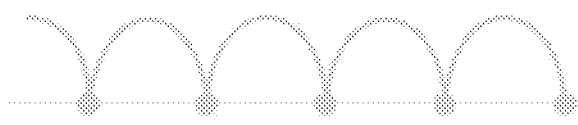
Figure 4:
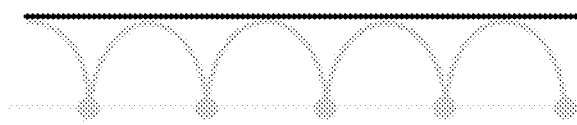
Figure 4:
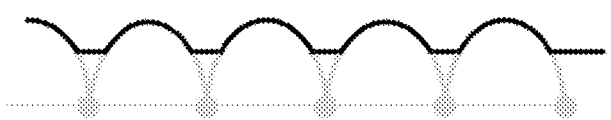

FIG. 4 is a timing diagram 400 illustrating the relationship between the number of transitions and timing error, in accordance with various embodiments. The timing diagram 400 includes an input code(n) waveform 405, delta(n) waveform 410, and error profile waveforms 415a-415c.

Conventional DEM attempts to break the static deterministic relationship between the digital input, code(n) (also referred to as $d_a[n]$), and unary code $u_i(n)$ (also referred to as $d_u[n]$), where $u_i(n)$=B2T(code(n)), where B2T is a binary-to-thermometer code conversion. Instead, a dynamic relationship is created, where $u_i(n)$=DEM(code(n)), which converts amplitude errors ($r_i$), delay errors ($t_{del,i}$), and duty-cycle errors ($t_{cyc,i}$) to noise instead of harmonic distortion (HDx). Generally, DEM can increase switching activity, leading to higher RMS values of total delay error $e_{del}(n)$ and total duty-cycle error $e_{cyc}(n)$, and increased degradation to SNDR. Thus, with conventional DEM, spurious free dynamic range (SFDR) may be improved at the expense of some degradation in signal-to-noise and dispersion ratio (SNDR), and while HD2 remains.

As can be seen in the error profile waveforms 415a-415c, with conventional DEM, error introduced due to duty-cycle mismatch may be the same for rising edge transitions and falling edge transitions. Thus, the duty-cycle error may be seen to have an error profile given by the absolute value of the delta(n) (used interchangeably with "delta code," and "Δ[n]"), exhibiting a 2× signal frequency pattern. Thus second harmonic distortion (HD2) may remain under a conventional DEM scheme.

Accordingly, a CTR-DEM scheme may enforce a constant transition rate, with $N_{tm}$ transitions of unit elements each cycle. By enforcing a constant number of unit element transitions, or additional transitions where necessary (e.g., ~$N_{tm}$ or $N_{tm+1}$), this may mitigate DAC switching current ($I_{sw}$) and pre-driver ISI for $N_{tm}$ relative to the absolute value of delta(n). Moreover, CTR-DEM may perform a fixed number of transitions irrespective of code or delta code. Thus, removing dependency on the code spreads the error as noise instead of a spur.

Error profile 415a illustrates an example in which $N_{tm}$ is set too high. Because $N_{tm}$ is too high, an increase in the noise floor is exhibited. In various examples, a constant transition rate may be realized with an $N_{extra}$ number of "extra" switches that are more than needed to produce a given delta code (e.g., abs(delta(n))). Thus, the extra switching may be given as: $N_{extra}=N_{tm}$-abs(delta(n)), where abs(delta(n)) is the absolute value of delta(n). $N_{extra}$ may always be an even value, such that any transition turning off a cell that was on is matched with corresponding transition turning on a cell that was off.

Error profile 415b illustrates an example where an $N_{tm}$ opt is utilized. Here, $N_{tm\_opt}$ is set equal to max(delta(n)). This may result in an error profile with no HD2 and a minimum noise floor needed to suppress HD2. The optimum $N_{tm}$ may be directly proportional to the amplitude and frequency of the input code/signal. Error profile 415c is an example in which $N_{tm}$ is set too low. Because $N_{tm}$ is too low, the peaks of abs(delta(n)) may remain exposed, leading to the appearance of HD2 spurs.

Thus, by tuning the $N_{tm}$, the proposed CTR-DEM may realize improved SNDR over conventional DEM, close to no-DEM levels, while removing all mismatch related spurs. By tuning $N_{tm}$, CTR-DEM has the ability to maintain optimal SNDR across different power levels, carrier frequencies, etc., thereby creating a lower noise floor that scales with signal power and carrier frequency, while also improving SFDR. In some examples, tuning (e.g., adjusting) of $N_{tm}$ may further include checking for $N_{tm}$ clipping, as described above with respect to clipping detection logic 210 of FIG. 2.

Figure 5:
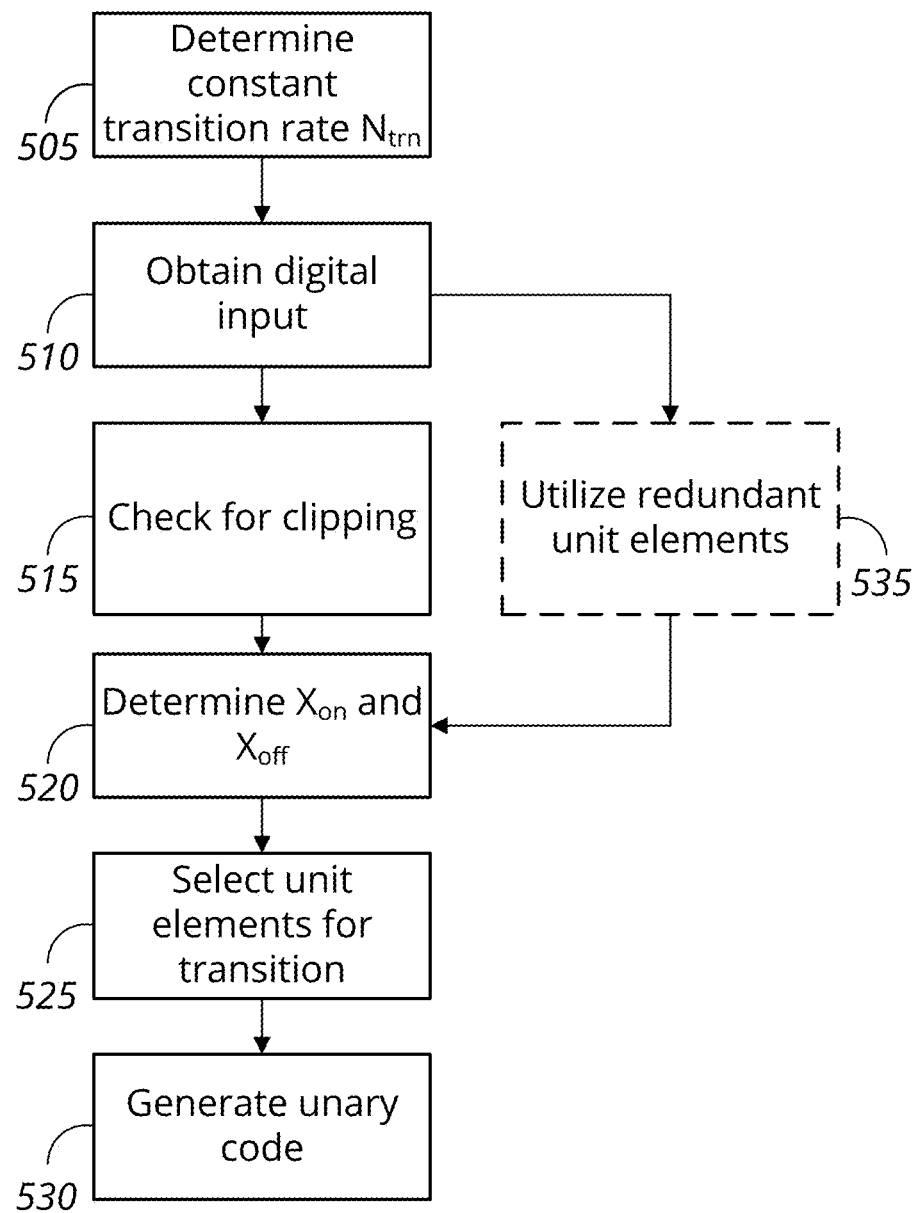
FIG. 5 is a flow diagram of a method for transition aware dynamic element matching, in accordance with various embodiments.

FIG. 5 is a flow diagram of a method 500 for transition aware dynamic element matching, in accordance with various embodiments. The method 500 begins, at block 505, by determining a constant transition rate ($N_{tm}$). As previously described, in some examples, $N_{tm}$ may be a number of transitions to be performed. For example, a transition may indicate a change in state of a unit element from an off state to an on state, or an on state to an off state, wherein the state of a unit element, as used herein, refers to whether the unit element is on (e.g., on state) or off (e.g., off state). In the CTR-DEM logic, the number of transitions may be the number of transitions in the unary code from a previous cycle (e.g., 1 to 0, or 0 to 1).

In some examples, $N_{tm}$ may be set as a static value. In other examples, $N_{tm}$ may be an adjustable value. For example, in some embodiments, $N_{tm}$ may be set by a user. In other examples, $N_{tm}$ may be adjusted on-the-fly and/or in real-time based on system requirements and/or metrics. In yet further embodiments, $N_{tm}$ may be a hard-coded value. In some examples, the hard-coded value may be determined based on known signal characteristics for a given use case or for one or more common applications. Tuning of $N_{tm}$ to an optimal value is further discussed above, with respect to FIGS. 2 and 4. In some examples, $N_{tm}$ may be determined based on a maximum amplitude of a delta code, plus an $N_{extra}$ number of extra transitions, as previously described.

The method 500 may continue, at block 510, by obtaining a digital input (e.g., $d_a[n]$) for a current cycle (e.g., a current sampling interval of a DAC). In various examples, the digital input may be a binary-coded digital signal indicating a signal to be converted to an analog signal. In some examples, the digital input for the current cycle may be compared against the digital input from a previous cycle (e.g., $d_a[n-1]$) to determine a delta code, as previously described.

At block 515, the method 500 continues by checking for clipping. In some examples, $N_{tm}$ may be checked for clipping based on the digital input. Specifically, $N_{tm}$ may be compared against the value of the digital input, $d_a$, to ensure a corresponding unary code can be generated by an $N_{tm}$ number of transitions. In some examples, clipping may be checked by ensuring the condition: $d_a<N_{tm}/2<N_u-d_a$. In some examples, if clipping is detected, the number of transitions, $N_{tm}$, may be reduced. On the other hand, if $N_{tm}$ is too low, then HD2 and other harmonic distortion may appear. In some examples, if $N_{tm}$ is too low, the clipping detection logic may be configured to add additional transitions (e.g., $N_{tm}+1$).

In some embodiments, the method 500 may further include, at block 535, alternatively and/or additionally utilizing one or more redundant unit elements. As previously described, in some examples, the DAC may further include one or more redundant unit elements. In such embodiments, the one or more redundant unit elements may be switched on or off as needed to avoid clipping. In some examples, the one or more redundant elements may act as "zero padding" for the input code, and remain in an off state (or in some examples an on state) until the one or more redundant unit elements are needed to enforce $N_{tm}$ transitions for a given input code, even as the code approaches 0 code (e.g., an all "0" code) or full code (e.g., an all "1" code). In this configuration, $L_{tm}$ may be equal to $N_{tm}$. Thus, in some examples the check for clipping described above may be skipped, and the one or more redundant unit elements used instead. In other embodiments, the one or more redundant unit elements may be utilized in combination with the check for clipping.

At block 520, the method 500 continues by determining a number of unit elements to be switched on (from an off state), $X_{on}$, and number of unit elements to be switched off (from an on state), $X_{off}$. In some examples, $X_{on}$ and $X_{off}$ may be determined based on the delta code $\Delta[n]$. For example, the delta code may indicate a change in the digital signal from a previous cycle. Thus, the delta code may indicate a decrease in the input code, which may correspond to a number of additional unit elements to be turned off, or an increase in the input code, which may correspond to a number of additional unit elements to be turned on. Accordingly, in some examples, the relationship between $X_{on}$ and $X_{off}$ may be expressed as: $X_{on}=X_{off}+\Delta[n]$. When $\Delta[n]$ is positive, indicating an increase in the digital input, the number of unit elements to be switched on (e.g., $X_{on}$) may be $\Delta[n]$ more than the number of unit elements to be switched off (e.g., $X_{off}$). Conversely, when $\Delta[n]$ is negative, indicating a decreased digital input value, $X_{on}$ may be smaller than $X_{off}$ by $\Delta[n]$.

The method 500 continues, at block 525, by selecting unit elements for transition. In various embodiments, random permutation logic may be implemented to select individual unit elements for transition from an on to an off state (based on $X_{off}$), and from an off to an on state (based on $X_{on}$). As previously described, random permutation logic may include various types of DEM algorithms, including, without limitation, random averaging, clocked averaging, individual level averaging, data weighted averaging, etc., for randomizing and/or selecting individual unit elements to be switched on or off. In yet further embodiments, random permutation logic may alternatively include or be replaced by a deterministic DEM algorithm. For example, the elements that are switched may be evenly distributed over time according to a deterministic pattern and/or sequence, such that timing error attributable to individual unit elements are evenly spread for specific transitions. For example, for an $N_{tm}$ number of transitions, the $idx_{on}$ and/or $idx_{off}$ may be adjusted by the random permutation logic to follow a deterministic pattern and/or sequence of which bits (e.g., corresponding unit elements) are to be switched on or switched off.

In some examples, a first permutation logic circuit may be configured to determine which individual unit elements should be turned off (e.g., unit elements to be switched off that were previously on), based on the input $X_{off}$, indicating the number of unit elements to be switched off, and a signal indicating which individual unit elements were turned on ($idx_{on}$) during a previous cycle (e.g., a previous sampling interval). Accordingly, in some examples, $idx_{on}$ may be equal to the input unary code of the previous cycle, $d_u[n-1]$. Thus, in some examples, the first random permutation logic circuit may select $X_{off}$ number of unit elements to be turned off from the unit elements indicated to have been on by the signal $idx_{on}$ according to a randomization and/or stochastic selection algorithm (e.g., a dynamic element matching algorithm). The first random permutation logic may then output a signal indicative of which unit elements have been selected to be turned off, $sel_{off}$.

The second random permutation logic may be configured to determine which individual unit elements should be turned on (e.g., unit elements to be switched on that were previously off), based on the input $X_{on}$, indicating the number of unit element to be switched on, and a signal indicating which of the individual unit elements were turned off ($idx_{off}$) during the previous cycle. Accordingly, $idx_{off}$ may be equal to the inverse of $d_u[n-1]$. Thus, in some examples, the second random permutation logic may select $X_{on}$ number of unit elements to be turned on from the unit elements indicated to have been off by the signal $idx_{off}$ according to a randomization and/or stochastic selection algorithm (e.g., dynamic element matching algorithm). The second random permutation logic may output a signal indicative of which unit elements have been selected to be turned on, $sel_{on}$.

The method 500 further includes, at block 530, generating unary code for the current cycle. In various examples, the unary code for the current cycle may be generated based on the $sel_{on}$ and $sel_{off}$ outputs indicating the selected units for transitions. As previously described, in some examples, the output signals, $sel_{on}$ and $sel_{off}$, may be provided to a multiplexer as control signals for selecting between inputs of the multiplexer. Specifically, the inputs of the multiplexer may include the input unary code of the previous cycle, $d_u[n-1]$ input, logic 1 (e.g., logic high), and logic 0 (e.g., logic low). According to some examples, $sel_{off}$ in the i-th bit position ($sel_{off,i}$) may be equal 1 if the corresponding i-th unit element is to be turned off, and set equal to 0 when there is no change. Similarly, $sel_{on}$ in the i-th bit position ($sel_{on,i}$) may be equal 1 if the corresponding i-th unit element is to be turned on, and set equal to 0 when there is no change. In some examples, $sel_{off,i}$ and $sel_{on,i}$ may form a 2-bit control signal to the multiplexer for selecting the various inputs. Thus, if an i-th unit element of the DAC is to be switched off, a control signal of 10 may be generated, indicating that logic 0 should be output by the multiplexer. Similarly, if the i-th unit element of the DAC is to be switched on, a control signal of 01 may be generated, indicating that logic 1 should be output by the multiplexer. If a control signal of 00 is output, it may indicate that no transition should take place for the i-th unit element, and the unary code of the previous cycle in the i-th position, $d_{u,i}[n-1]$, may be output by the multiplexer. In this way, in some examples, the multiplexer may generate new input unary code for a current cycle, $d_u[n]$. In further examples, the current input unary cycle may then be stored, for example, at a flip-flop, where the flip-flop may be clocked by a clock signal having a period equal to a sample interval. In yet further embodiments, generation of the unary code may be performed through logic or components other than the multiplexer. For example, so long as the generated unary code reflects the transitions of the unit elements (e.g., to be switched on and switched off), based on the signals $sel_{off}$ and $sel_{on}$, other suitable circuitry may be used to generate unary code $d_u[n]$ described above. Accordingly, in further examples, the states of each unit element of a DAC may be controlled according to the unary code, as previously described with respect to FIG. 3.

The techniques and processes described above with respect to various embodiments may be performed by one or more systems 100 and/or subsystems and components thereof, such as transition aware DEM encoder logic circuit 200 as described above with respect to FIGS. 1-2, and which may perform the methods provided by various other embodiments, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A method comprising:
    determining a number of unit elements of a digital-to-analog converter to be transitioned ($N_{tm}$) from an on state to an off state, or an off state to an on state;
    determining a first number of unit elements of a digital-to-analog converter to be turned on from an off state, based, at least in part, on $N_{tm}$;
    determining a second number of unit elements of the digital-to-analog converter to be turned off from an on state, based, at least in part, on $N_{tm}$;
    selecting, via dynamic element matching logic, the first number of individual unit elements from one or more unit elements of the digital-to-analog converter in the off state to be turned on; and
    selecting, via the dynamic element matching logic, the second number of individual unit elements from one or more unit elements of the digital-to-analog converter in the on state to be turned off.

2. The method of claim 1, further comprising:
    generating a unary code, wherein the unary code is configured to turn on the selected first number of individual unit elements, and turn off the selected second number of individual unit elements, wherein each respective bit position of the unary code controls a state of a respective unit element corresponding to the respective bit position; and
    controlling the state of each of the plurality of unit elements of the digital-to-analog converter based on the unary code.

3. The method of claim 1, further comprising:
    determining whether an $N_{tm}$ number of transitions of the plurality of unit elements of the digital-to-analog converter can be performed for a current value of a digital input during a current sampling interval.

4. The method of claim 3, wherein determining whether the $N_{tm}$ number of transitions can be performed further includes:
    determining whether the current value of the digital input is less than ($N_{tm}/2$), and further that the total number of unit elements minus the current value of the digital input is greater than ($N_{tm}/2$).

5. The method of claim 3, further comprising:
    adjusting $N_{tm}$ based on a determination that the $N_{tm}$ number of transitions cannot be performed, wherein adjusting $N_{tm}$ includes reducing the value of $N_{tm}$.

6. The method of claim 1, wherein $N_{tm}$ is set equal to the maximum of the absolute value of a delta code plus an $N_{extra}$ number of transitions, wherein $N_{extra}$ is an even integer, and wherein the delta code indicates a change in a current value of a digital input during a current sampling interval from a previous value of the digital input during a previous sampling interval.

7. The method of claim 1, wherein selecting the first number of individual unit elements to be turned on, and the second number of individual unit elements to be turned off, further includes:
    selecting the first number of individual unit elements from the one or more unit elements of the digital-to-analog converter in the off state to be turned on, according to a randomization algorithm; and
    selecting the second number individual unit elements from the one or more unit elements of the digital-to-analog converter in the on state to be turned off, according to the randomization algorithm.

8. The method of claim 7, wherein the randomization algorithm includes at least one of random averaging, clocked averaging, individual level averaging, or data weighted averaging.

9. A logic circuit comprising:
    a register configured to store a constant transition rate value, wherein the constant transition rate value is given by a number of unit elements of a digital-to-analog converter to be transitioned ($N_{tm}$), from an on state to an off state, or an off state to an on state, at each sample interval;
    a dynamic element matching circuit coupled to the register, wherein the dynamic element matching circuit is configured to:
        determine a first number of unit elements of a digital-to-analog converter to be turned on from an off state, based, at least in part, on $N_{tm}$;
        determine a second number of unit elements of the digital-to-analog converter to be turned off from an on state, based, at least in part, on $N_{tm}$;
        generate a first signal, wherein the first signal indicates a selection of the first number of individual unit elements, wherein the first signal further identifies the individual unit elements of one or more unit elements of the digital-to-analog converter in the off state to be turned on; and
        generate a second signal, wherein the second signal indicates a selection of the second number of individual unit elements, wherein the second signal further identifies the individual unit elements of one or more unit elements of the digital-to-analog converter in the on state to be turned off.

10. The logic circuit of claim 9, wherein the dynamic element matching circuit is further configured to:
    generate a unary code of a current sample interval based on the first and second signals, wherein the unary code is configured to turn on the identified first number of individual unit elements, and turn off the identified second number of individual unit elements, wherein each respective bit position of the unary code controls a state of a respective unit element corresponding to the respective bit position; and
    control the state of each of the plurality of unit elements of the digital-to-analog converter based on the unary code.

11. The logic circuit of claim 10, wherein the dynamic element matching circuit further comprises a multiplexer, wherein the multiplexer receives, at its inputs, a logic level low, a logic level high, and a unary code of a previous sample interval, wherein the multiplexer is configured to output the unary code of the current sample interval based, at least in part, on the first and second signals.

12. The logic circuit of claim 9, wherein the dynamic element matching circuit is further configured to:
    determine whether an $N_{tm}$ number of transitions of the plurality of unit elements of the digital-to-analog converter can be performed for a current value of a digital input during a current sampling interval.

13. The logic circuit of claim 12, wherein determining whether the $N_{tm}$ number of transitions can be performed further includes:
    determining whether the current value of the digital input is less than ($N_{tm}/2$), and further that the total number of unit elements minus the current value of the digital input is greater than ($N_{tm}/2$).

14. The logic circuit of claim 12, wherein generating the first and second signals further includes:

selecting the first number of individual unit elements from the one or more unit elements of the digital-to-analog converter in the off state, according to a randomization algorithm; and selecting the second number of individual unit elements from the one or more unit elements of the digital-to-analog converter in the on state, according to the randomization algorithm.

15. A system comprising:

a digital-to-analog converter comprising a plurality of unit elements, each unit element configured to be controllable by a control signal;

an encoder coupled to the digital-to-analog converter, the encoder configured to generate the control signal based on a digital input, wherein the encoder includes a circuit, wherein the circuit is configured to:

determine a number of unit elements of a digital-to-analog converter to be transitioned ($N_{tm}$) from an on state to an off state, or an off state to an on state;

determine a first number of unit elements of a digital-to-analog converter to be turned on from an off state of an $N_{tm}$ number of transitions;

determine a second number of unit elements of the digital-to-analog converter to be turned off from an on state of the $N_{tm}$ number of transitions;

generate a first signal, wherein the first signal indicates a selection of the first number of individual unit elements, wherein the first signal further identifies the individual unit elements of one or more unit elements of the digital-to-analog converter in the off state to be turned on; and generate a second signal, wherein the second signal indicates a selection of the second number of individual unit elements, wherein the second signal further identifies the individual unit elements of one or more unit elements of the digital-to-analog converter in the on state to be turned off.

16. The system of claim 15, wherein the circuit is further configured to:

generate the control signal of a current sample interval based on the first and second signals, wherein the control signal is configured to turn on the identified first number of individual unit elements, and turn off the identified second number of individual unit elements, wherein each respective bit position of the control signal controls a state of a respective unit element corresponding to the respective bit position, wherein the control signal is unary-coded; and control the state of each of the plurality of unit elements of the digital-to-analog converter based on the control signal.

17. The system of claim 16, wherein the circuit further comprises a multiplexer, wherein the multiplexer receives, at its inputs, a logic level low, a logic level high, and a control signal of a previous sample interval, wherein the multiplexer is configured to output the control signal of the current sample interval based, at least in part, on the first and second signals.

18. The system of claim 15, wherein the circuit is further configured to determine whether an $N_{tm}$ number of transitions of the plurality of unit elements of the digital-to-analog converter can be performed for a current value of the digital input during a current sampling interval.

19. The system of claim 18, wherein determining whether the $N_{tm}$ number of transitions can be performed further includes determining whether the current value of the digital input is less than ($N_{tm}/2$), and further that the total number of unit elements minus the current value of the digital input is greater than ($N_{tm}/2$).

20. The system of claim 15, wherein generating the first and second signals further includes:

selecting the first number of individual unit elements from the one or more unit elements of the digital-to-analog converter in the off state, according to a randomization algorithm; and selecting the second number of individual unit elements from the one or more unit elements of the digital-to-analog converter in the on state, according to the randomization algorithm.

\* \* \* \* \*

UNITED STATES PATENT AND TRADEMARK OFFICE
CERTIFICATE OF CORRECTION

PATENT NO. : 11,569,830 B1
APPLICATION NO. : 17/589606
DATED : January 31, 2023
INVENTOR(S) : Ahmed Elkholy et al.

It is certified that error appears in the above-identified patent and that said Letters Patent is hereby corrected as shown below:

On the Title Page

Item (57) Line 6, "($N_{tm}$)" should be ($N_{trn}$)

In the Specification

Column 2, Line 1, "($N_{tm}$)" should be ($N_{trn}$)

Column 2, Line 5, "$N_{tm}$" should be $N_{trn}$

Column 2, Line 8, "$N_{tm}$" should be $N_{trn}$

Column 2, Line 22, "($N_{tm}$)" should be $N_{trn}$

Column 2, Line 28, "$N_{tm}$" should be $N_{trn}$

Column 2, Line 30, "$N_{tm}$" should be $N_{trn}$

Column 2, Line 53, "($N_{tm}$)" should be $N_{trn}$

Column 2, Line 57, "$N_{tm}$" should be $N_{trn}$

Column 2, Line 59, "$N_{tm}$" should be $N_{trn}$

Column 6, Line 23, Eq. 2, "$e_{del}(n) = \Sigma_{i=1}^{j} - (u_i(n) - u_i(n-1)) t_{del,i}$" should be $e_{del}(n) = \sum_{i=1}^{j} -(u_i(n) - u_i(n-1)) t_{del,i}$ Signed and Sealed this
Eighteenth Day of April, 2023

*Katherine Kelly Vidal*
Katherine Kelly Vidal
*Director of the United States Patent and Trademark Office*

Column 6, Line 26, Eq. 3, "$e_{cyc}(n) = \Sigma_{i=1}^{j} | u_i(n) - u_i(n-1) | t_{cyc,i}$" should be $$e_{cyc}(n) = \sum_{i=1}^{j} | u_i(n) - u_i(n-1) | t_{cyc,i}$$

Column 6, Line 57, "($N_{tm}$)" should be ($N_{trn}$)

Column 6, Line 58, "$N_{tm}$" should be $N_{trn}$

Column 6, Line 61, "$N_{tm}$" should be $N_{trn}$

Column 7, Line 1, "$N_{tm}$" should be $N_{trn}$

Column 7, Line 2, "$N_{tm}$" should be $N_{trn}$

Column 7, Line 3, "$N_{tm}$" should be $N_{trn}$

Column 7, Line 8, "$N_{tm}$" should be $N_{trn}$

Column 7, Line 9, "$N_{tm}$" should be $N_{trn}$

Column 7, Line 11, "$N_{tm\_opt}$" should be $N_{trn\_opt}$

Column 7, Line 14, "$N_{tm}$" should be $N_{trn}$

Column 7, Line 15, "$N_{tm}$" should be $N_{trn}$

Column 7, Line 20, "$N_{tm\_opt}$" should be $N_{trn\_opt}$

Column 7, Line 24, "$N_{tm\_opt}$" should be $N_{trn\_opt}$

Column 7, Line 26, "$N_{tm}$" should be $N_{trn}$

Column 7, Line 30, "$N_{tm}$" should be $N_{trn}$

Column 7, Line 32, "$N_{tm}$" should be $N_{trn}$

Column 7, Line 33, "$d_\alpha < N_{tm}/2 < N_u - d_\alpha$" should be $d_a < N_{trn}/2 < N_u - d_a$ Column 7, Line 35, "$N_{tm}$" should be $N_{trn}$ Column 7, Line 37, "$N_{tm}$" should be $N_{trn}$ Column 7, Line 38, "$N_{tm}/2 > N_u - d_\alpha$" should be $N_{trn}/2 > N_u - d_a$ Column 7, Line 39, "$N_{tm}$" should be $N_{trn}$

CERTIFICATE OF CORRECTION (continued)
U.S. Pat. No. 11,569,830 B1

Column 7, Line 40, "if $N_{tm}$ is" should be if $N_{trn}$ is

Column 7, Line 40, "examples, $N_{tm}$ may" should be examples, $N_{trn}$ may

Column 7, Line 41, "$N_{tm}$" should be $N_{trn}$

Column 7, Line 43, "$N_{tm}$" should be $N_{trn}$

Column 7, Line 44, "$N_{tm}+1$" should be $N_{trn}+1$

Column 7, Line 46, "$N_{tm}$" should be $N_{trn}$

Column 7, Line 47, "$d_\alpha < N_{tm}/2 < N_u - d_\alpha$" should be $d_a < N_{trn}/2 < N_u - d_a$ Column 7, Line 48, "$L_{tm}$" should be $L_{trn}$ Column 7, Line 57, "$N_{tm}$" should be $N_{trn}$ Column 7, Line 59, "$L_{tm}$" should be $L_{trn}$ Column 7, Line 60, "$N_{tm}$" should be $N_{trn}$ Column 8, Line 6, "$L_{tm}$" should be $L_{trn}$ Column 8, Line 7, "$X_{on}+X_{off}=L_{tm}$" should be $X_{on}+X_{off}=L_{trn}$ Column 8, Line 22, "$L_{tm}$" should be $L_{trn}$ Column 8, Line 25, "$L_{tm}$" should be $L_{trn}$ Column 10, Line 20, "$N_{tm}=5$" should be $N_{trn}=5$ Column 10, Line 21, "$N_{tm}$" should be $N_{trn}$ Column 10, Line 26, "$N_{tm}$" should be $N_{trn}$ Column 10, Line 65, "$N_{tm}$" should be $N_{trn}$ Column 11, Line 1, "$\sim N_{tm}$ or $N_{tm+1}$" should be $\sim Nt_{rn}$ or $Nt_{rn}+i$ Column 11, Line 2, "$N_{tm}$" should be $N_{trn}$ Column 11, Line 7, "$N_{tm}$" should be $N_{trn}$ Column 11, Line 8, "$N_{tm}$" should be $N_{trn}$

CERTIFICATE OF CORRECTION (continued)
U.S. Pat. No. 11,569,830 B1

Column 11, Line 13, "$N_{tm}$" should be $N_{trn}$

Column 11, Line 18, "$N_{tm}$" should be $N_{trn}$

Column 11, Line 19, "$N_{tm\_opt}$" should be $N_{trn\_opt}$

Column 11, Line 21, "$N_{tm}$" should be $N_{trn}$

Column 11, Line 24, "which $N_{tm}$ is" should be which $N_{trn}$ is

Column 11, Line 24, "Because $N_{tm}$ is" should be Because $N_{trn}$ is

Column 11, Line 27, "$N_{tm}$" should be $N_{trn}$

Column 11, Line 30, "$N_{tm}$" should be $N_{trn}$

Column 11, Line 35, "of $N_{tm}$ may" should be of $N_{trn}$ may

Column 11, Line 35, "for $N_{tm}$ clipping" should be for $N_{trn}$ clipping

Column 11, Line 41, "($N_{tm}$)" should be $N_{trn}$

Column 11, Line 42, "$N_{tm}$" should be $N_{trn}$

Column 11, Line 51, "$N_{tm}$" should be $N_{trn}$

Column 11, Line 52, "$N_{tm}$" should be $N_{trn}$

Column 11, Line 53, "$N_{tm}$" should be $N_{trn}$

Column 11, Line 54, "$N_{tm}$" should be $N_{trn}$

Column 11, Line 56, "$N_{tm}$" should be $N_{trn}$

Column 11, Line 59, "$N_{tm}$" should be $N_{trn}$

Column 11, Line 61, "$N_{tm}$" should be $N_{trn}$

Column 12, Line 7, "$N_{tm}$" should be $N_{trn}$

Column 12, Line 8, "$N_{tm}$" should be $N_{trn}$

Column 12, Line 10, "$N_{tm}$" should be $N_{trn}$

Column 12, Line 12, "$d_\alpha < N_{tm}/2 < N_u - d_\alpha$" should be $d_a < N_{trn}/2 < N_u - d_a$

CERTIFICATE OF CORRECTION (continued)
U.S. Pat. No. 11,569,830 B1

Column 12, Line 14, "transitions, $N_{tm}$, may" should be transitions, $N_{trn}$, may Column 12, Line 14, "if $N_{tm}$" should be $N_{trn}$ Column 12, Line 16, "$N_{tm}$" should be $N_{trn}$ Column 12, Line 18, "$N_{tm}+1$" should be $N_{trn}+1$ Column 12, Line 29, "$N_{tm}$" should be $N_{trn}$ Column 12, Line 32, "$L_{tm}$" should be $L_{trn}$ Column 12, Line 32, "$N_{tm}$" should be $N_{trn}$ Column 13, Line 7, "$N_{tm}$" should be $N_{trn}$ In the Claims Column 15, Claim 1, Line 4, "($N_{tm}$)" should be $N_{trn}$ Column 15, Claim 1, Line 8, "$N_{tm}$" should be $N_{trn}$ Column 15, Claim 1, Line 11, "$N_{tm}$" should be $N_{trn}$ Column 15, Claim 3, Line 33, "$N_{tm}$" should be $N_{trn}$ Column 15, Claim 4, Line 39, "$N_{tm}$" should be $N_{trn}$ Column 15, Claim 4, Line 42, "($N_{tm}/2$)" should be ($N_{trn}/2$)

Column 15, Claim 4, Line 44, "($N_{tm}/2$)" should be ($N_{trn}/2$)

Column 15, Claim 5, Line 46, "adjusting $N_{tm}$ based" should be adjusting $N_{trn}$ based Column 15, Claim 5, Line 46, "the $N_{tm}$" should be the $N_{trn}$ Column 15, Claim 5, Line 48, "adjusting $N_{tm}$ includes" should be adjusting $N_{trn}$ includes Column 15, Claim 5, Line 48, "of $N_{tm}$" should be $N_{trn}$ Column 15, Claim 6, Line 49, "$N_{tm}$" should be $N_{trn}$ Column 16, Claim 9, Line 9, "($N_{tm}$)" should be $N_{trn}$ Column 16, Claim 9, Line 17, "$N_{tm}$" should be $N_{trn}$

CERTIFICATE OF CORRECTION (continued)
U.S. Pat. No. 11,569,830 B1

Column 16, Claim 9, Line 20, "$N_{tm}$" should be $N_{trn}$

Column 16, Claim 12, Line 55, "$N_{tm}$" should be $N_{trn}$

Column 16, Claim 13, Line 60, "$N_{tm}$" should be $N_{trn}$

Column 16, Claim 13, Line 63, "$(N_{tm}/2)$" should be $(N_{trn}/2)$

Column 16, Claim 13, Line 65, "$(N_{tm}/2)$" should be $(N_{trn}/2)$

Column 17, Claim 15, Line 18, "$(N_{tm})$" should be $(N_{trn})$

Column 17, Claim 15, Line 22, "$N_{tm}$" should be $N_{trn}$

Column 17, Claim 15, Line 25, "$N_{tm}$" should be $N_{trn}$

Column 18 Claim 18 Line 20, "$N_{tm}$" should be $N_{trn}$

Column 18, Claim 19, Line 25, "$N_{tm}$" should be $N_{trn}$

Column 18, Claim 19, Line 26, "$(N_{tm}/2)$" should be $(N_{trn}/2)$

Column 18, Claim 19, Line 28, "$(N_{tm}/2)$" should be $(N_{trn}/2)$